United States Patent
Anglada et al.

[11] Patent Number: 5,805,520
[45] Date of Patent: Sep. 8, 1998

[54] INTEGRATED CIRCUIT ADDRESS RECONFIGURABILITY

[75] Inventors: Edward Anglada, Aguadilla; Hector L. Gonzalez, Areibo, both of Puerto Rico

[73] Assignee: Hewlett-Packard Company, Palo Alto, Calif.

[21] Appl. No.: 842,973

[22] Filed: Apr. 25, 1997

[51] Int. Cl.⁶ .............................. G11C 8/00; G11C 7/00
[52] U.S. Cl. .............................. 365/230.02; 365/230.08; 365/189.02
[58] Field of Search .................. 365/230.02, 230.08, 365/189.02

[56] References Cited

U.S. PATENT DOCUMENTS

| | | | |
|---|---|---|---|
| 4,724,531 | 2/1988 | Angleton et al. | 365/190 |
| 4,994,896 | 2/1991 | Uemura et al. | 257/724 |
| 5,502,621 | 3/1996 | Schumacher et al. | 361/760 |
| 5,579,277 | 11/1996 | Kelly | 365/230.02 |

FOREIGN PATENT DOCUMENTS

| | | |
|---|---|---|
| 0430458A2 | 6/1991 | European Pat. Off. . |
| 4232267A1 | 3/1994 | Germany . |
| 2166899 | 5/1986 | United Kingdom . |

OTHER PUBLICATIONS

Samsung Electronics, data sheets for KM416S4030A/ KM416S4031A (Prelim. CMOS SDRAM) Published Apr. 1, 1996, 10 pages.

Primary Examiner—David C. Nelms
Assistant Examiner—Trong Phan
Attorney, Agent, or Firm—Richard F. Schuette

[57] ABSTRACT

An integrated circuit having an internal switch including remap-multiplexers that are actuated through either hardware or firmware for remapping external addresses such that the IC switches between a standard and a reverse pin assignment to simplify lead routing between a plurality of integrated circuits mounted on a PC board.

8 Claims, 7 Drawing Sheets

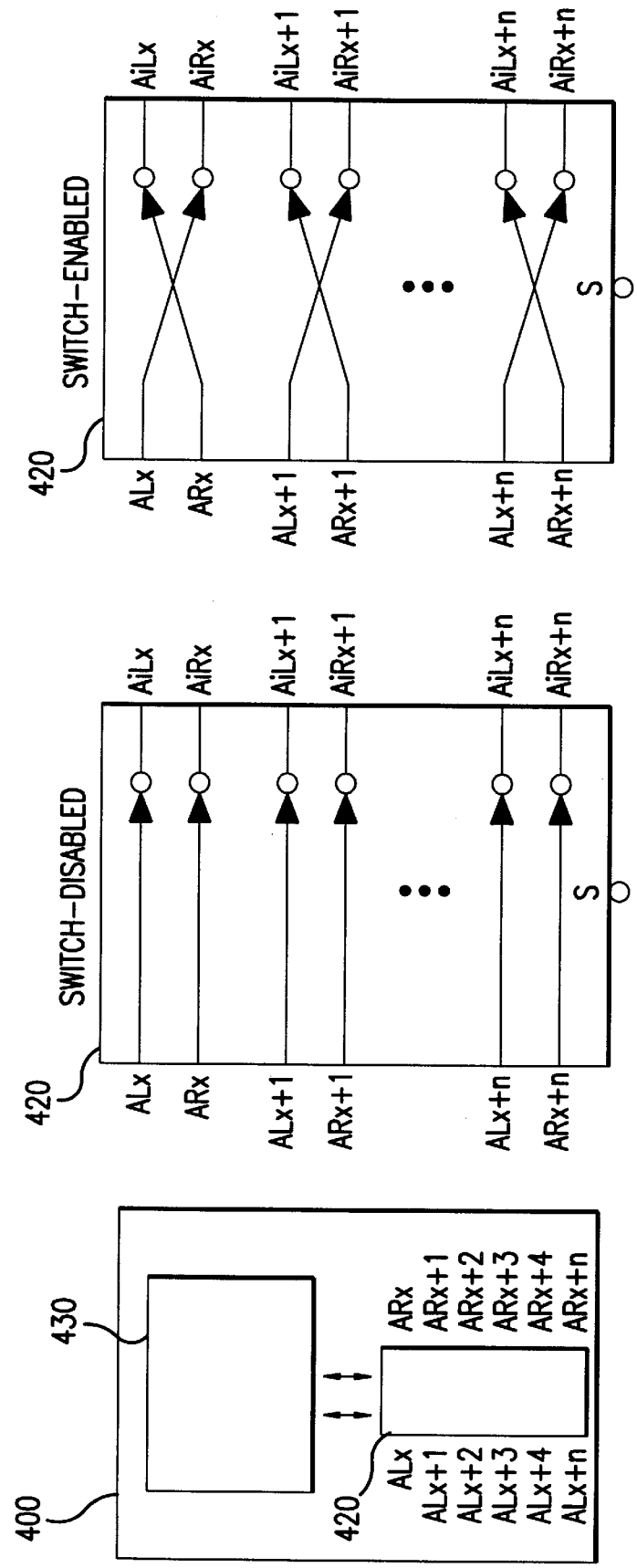

$AiLx = ALxS + ARx/S$
$AiRx = ARxS + ALx/S$

INTEGRATED CIRCUIT ADDRESS RECONFIGURABILITY

FIELD OF THE INVENTION

The present invention relates to methods and apparatus for Integrated Circuit (IC) address reconfigurability and, more particularly, to a method and apparatus for providing a single integrated circuit (IC) having external address pins that may be switched internally to provide either a standard pin assignment or a reverse pin assignment.

BACKGROUND OF THE INVENTION

Lead routing between Integrated Circuit's (IC's), for example SDRAM memories on a memory module printed circuit board (PC board) play an important role in both the cost and the performance of the PC board design. The cost of manufacturing a PC board is directly related to the number of layers required to effectively route all of the leads between the IC's. The ability to reduce the number of leads, match the length of leads and the potential for interference between leads enhances the performance of the PC board. As the IC density on PC boards increase and the number of pin assignments and associated leads per IC go up, lead routing becomes increasingly more difficult. In the mid-80's, surface mount technology (SMT) and double sided SMT were introduced as an alternative to standard through-hole PC board technology. Instead of pre-drilling PC boards to accept the pins of IC's, special packaging for IC's was developed which provided for gluing IC's to the PC board. Since the requirement for sticking pins through to the opposite side of the PC board and soldering the IC's in place was eliminated, it became possible to mount IC's on both sides of the PC board.

Even though SMT provides for increased efficiency in lead routing, problems still exist as the total number of IC's on the PC board doubles with two-sided SMT. The number of leads required to interconnect IC's goes up with both the total number of IC's on the PC board, as well as with advances in Very Large Scale Integration (VLSI) design (up to 1,000,000 components may now be integrated into a single IC). A standard 1 megabyte memory chip has 44 pin assignments, a custom memory controller chip may have over 200 pin assignments, and a multichip module (MCM) which approaches 2.5 centimeters square may have over 500 pin assignments.

The layout of a circuit board generally proceeds from the circuit diagram to a geometric layout in which IC's are grouped in their respective isolation regions. Leads coupling IC's are laid out to eliminate potential lead crossovers. Lead routing is a three dimensional problem and becomes very complex with high chip and associated lead densities. Lead crossovers are typically eliminated by adding additional layers to the circuit board such that leads can be re-routed through vias to different levels. Via is the term used to describe a hole partially through the circuit board which enables a lead to travel from one board level to another. Additionally, lead routing is made even more complex as constraints such as maximum length and a consistency between lead lengths must be provided for.

As circuit speeds increase the distributed capacitance and inductance over the length of each lead causes it to act like transmission lines. Reduction of the overall lead length reduces adverse electronic emissions from the circuit board. Crosstalk (an undesirable coupling between an active line and an adjacent passive line) may occur do to mutual inductance or capacitance. Crosstalk can also cause a loss of signal strength in the active line, and interference or false triggering in an adjacent line. Lateral crosstalk may occur when adjacent leads are located on the same plane. Leads located on opposite sides of a dielectric laminate may result in vertical crosstalk. Crosstalk can be minimized by increasing the distance between adjacent leads or reducing the length of parallel lead sections. Vertical crosstalk can be virtually eliminated by orthogonal routing of leads on adjacent layers.

In circuit boards incorporating more than one IC of the same type (for example, a memory module in which a large number of DRAM's or SDRAM's are coupled together), circuit board complexity, problems associated with crossover and crosstalk, can be minimized by utilizing pairs of integrated circuits designed with two identical but reversed pin assignments. As illustrated in FIG. 1, an eight MBIT Flash memory sold by Intel (F28F008SA) is offered in both a standard pin assignment (FIG. 1A) and a reversed pin assignment (FIG. 1B) configuration. By alternating the memory chips in a serpentine layout on one side of a PC board (FIG. 2), a reversed pin assignment on one half of the IC's provides for a greatly simplified board layout as crossovers and the length of the interconnecting leads are minimized. Unfortunately, two different IC's must be manufactured and proper placement on the PC board necessitates subsequent identification during IC insertion.

U.S. Pat. No. 5,502,621 to Schumacher et al. discloses a mirrored pin assignment designed to eliminate the requirement for two different IC's to provide a standard and a reversed pin assignment. One or more IC's having the same set of mirror image pin assignments are mounted on each side of a circuit board by rotating an IC 180 degrees in relationship to the other IC already positioned directly on the opposite side of the circuit board. The inherent mirror image of the pin assignments and the rotation by 180 degrees ensures that the pin assignments of the same type will be directly opposite each other and separated by the circuit board.

Many types of Dynamic Random Access Memories (DRAM's) are offered with a standard and a reversed pin assignment. Nevertheless, many manufacturers will only purchase a single type of DRAM to simplify automated insertion at the expense of added complexity to the PC board routing. Unfortunately, some types of SDRAM's are not offered in a reversed pin assignment such that lead routing is a problem.

A need exists for a single integrated circuit having the potential for both a standard pin assignment and a reverse pin assignment to eliminate the need for providing two different IC's. It would be advantageous to provide for a single integrated circuit in which the pin assignment may be reversed by an external control signal to activate an internal switch, or via firmware in which a command activates and internal switch to reverse the address pin assignments.

It would be desirable and of considerable advantage to provide for increasing the density of SDRAM's on memory modules without using two different types of SDRAM's.

There is accordingly a need for a single integrated circuit having an externally actuated internal switch that provides for both a standard pin assignment and a reverse pin assignment.

SUMMARY OF THE INVENTION

The invention is a method and apparatus for an integrated circuit having a pin assignment that is switchable between a standard and a reverse pin assignment to simplify lead routing when a plurality of such integrated circuits are mounted on either or both sides of a PC board. An internal switch is actuated through either hardware or firmware to control remap-multiplexers to implement the remapping of the pin assignments.

Other aspects and advantages of the present invention will be come apparent from the following detailed description, taken in conjunction with the accompanying drawings, illustrating by way of example the principles of the invention.

BRIEF DESCRIPTION OF THE DRAWINGS

FIG. 5A depicts a memory device having left and right address pins, 5B depicts the normal addressing of a remap-multiplexer that is not enabled, and FIG. 5C depicts the remapped addressing of a remap-multiplexer that is enabled in accordance with the preferred embodiment of the invention.

DETAILED DESCRIPTION OF THE PREFERRED EMBODIMENTS

Figure 1A:
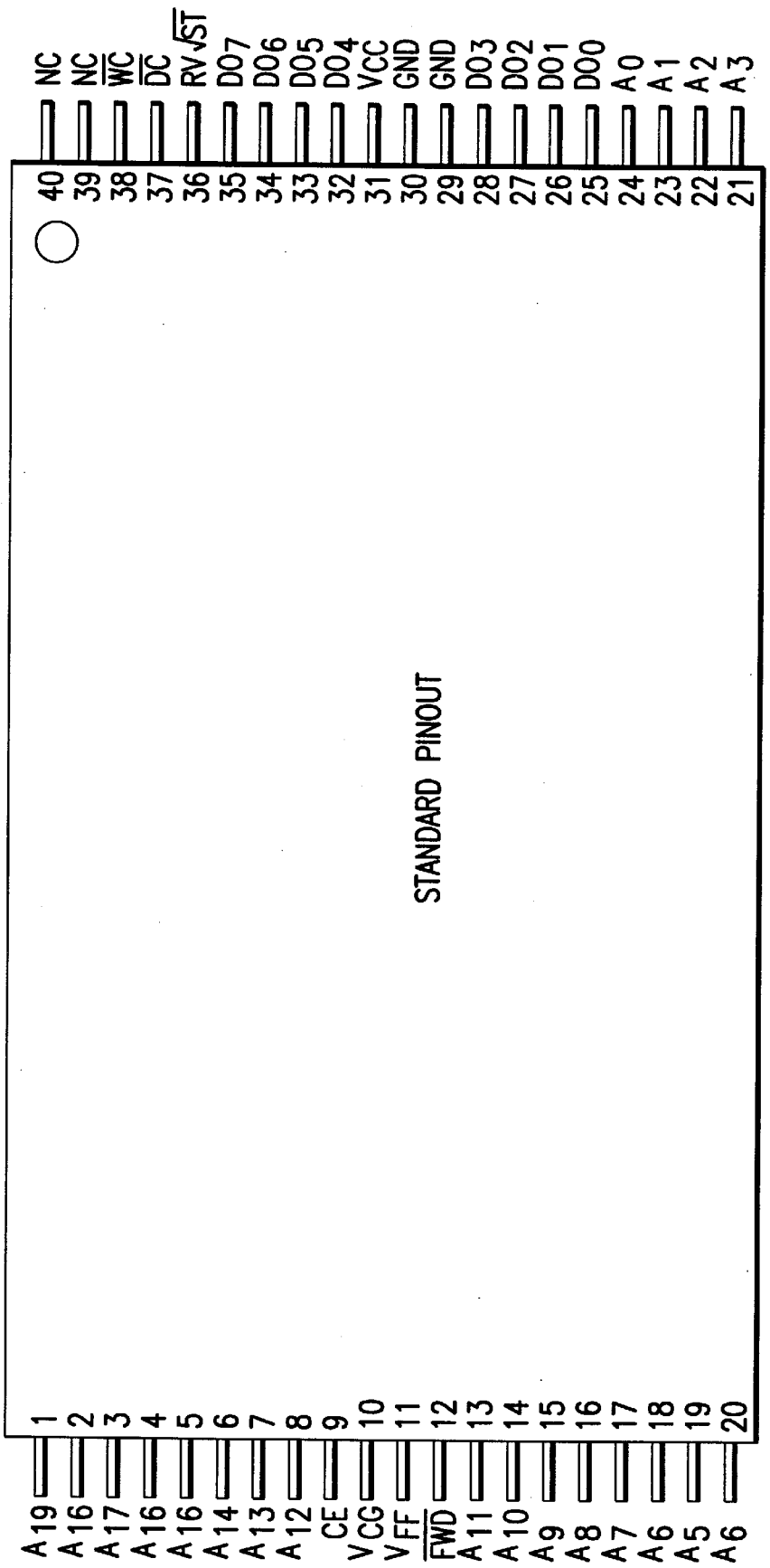
FIG. 1A is a plan view of a prior art IC having a standard pin assignment and FIG. 1B is a second IC having a reversed pin assignment.
Figure 1B:
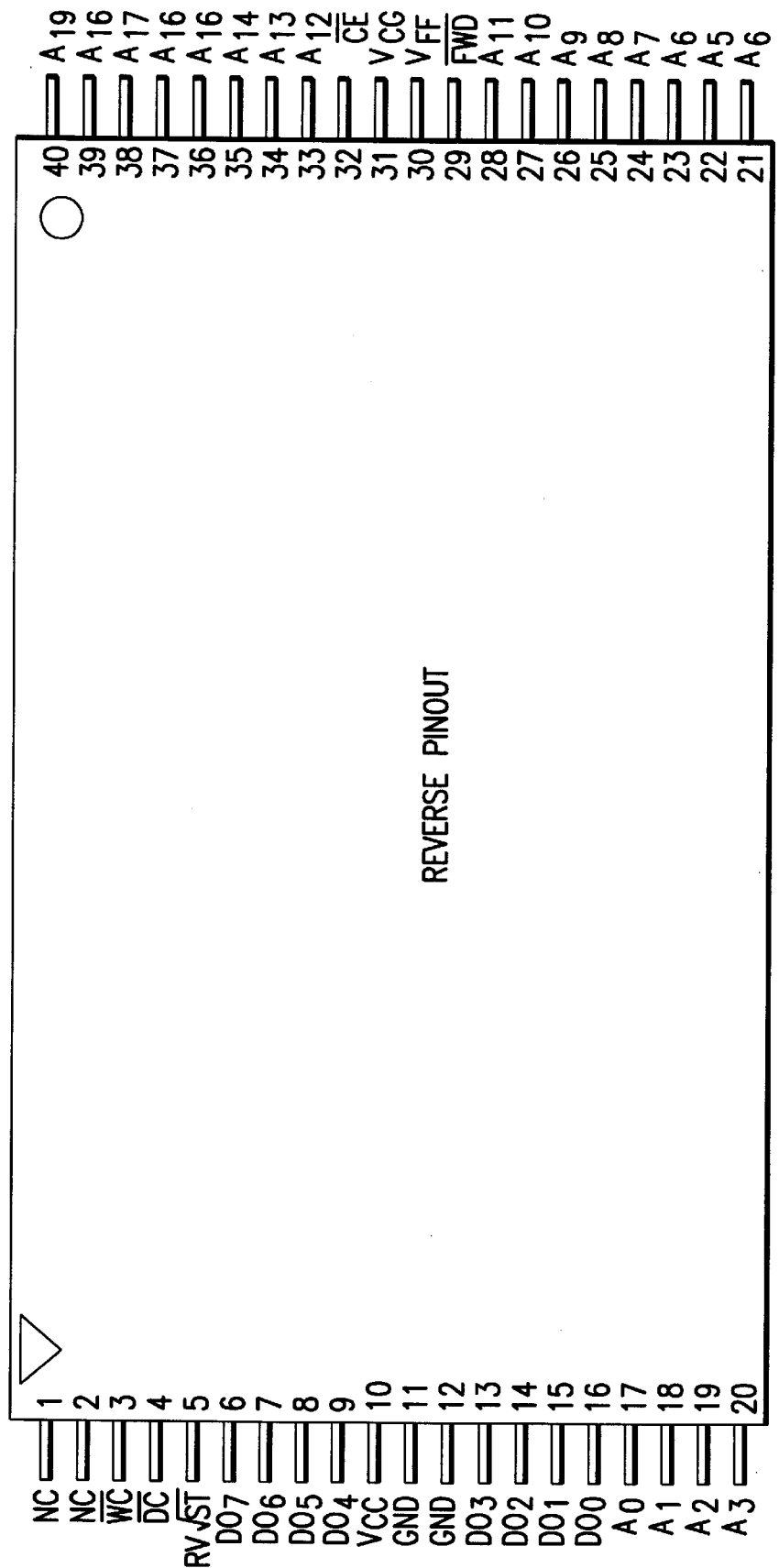
Figure 2:
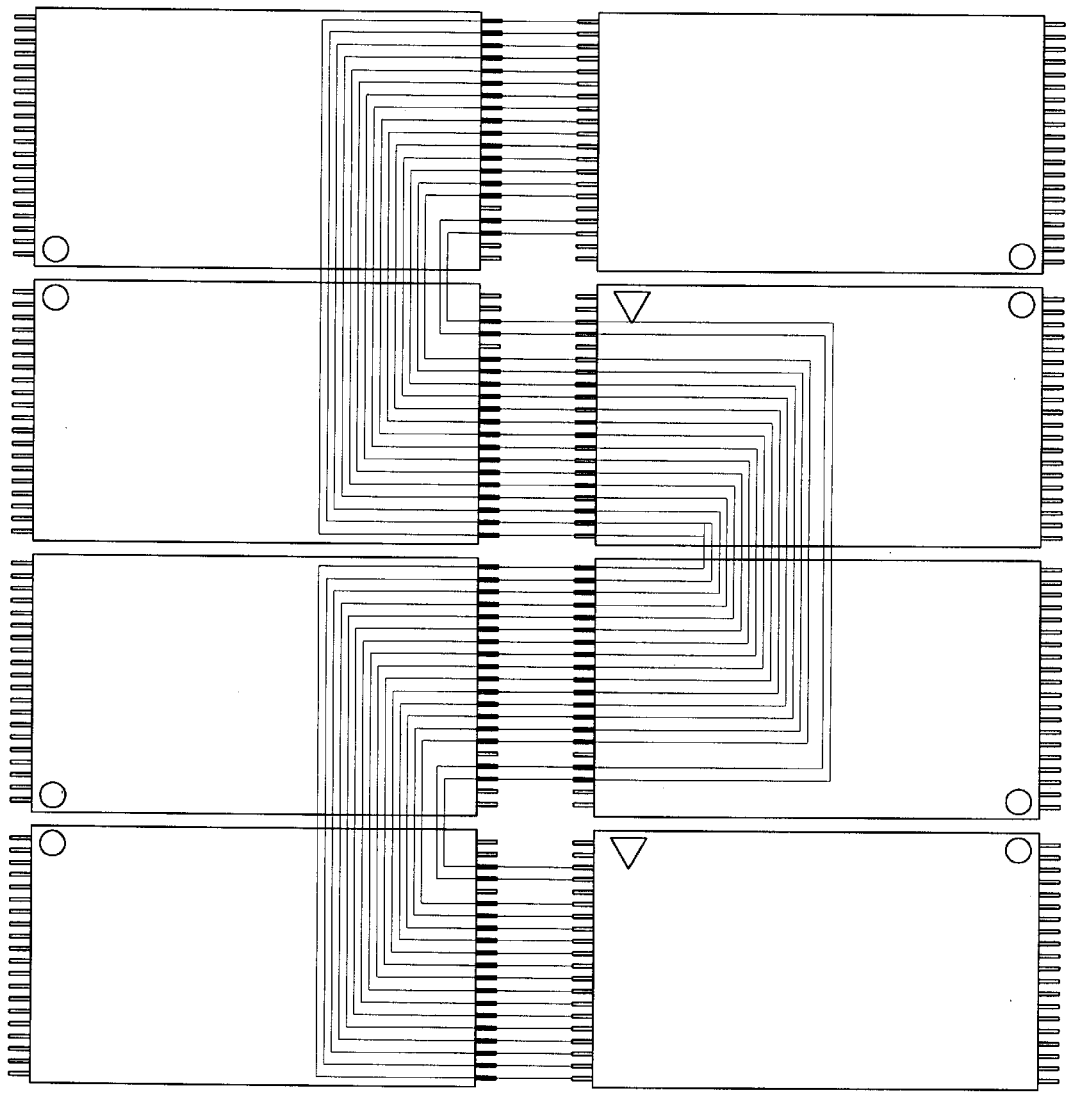
FIG. 2 is a plan view of a prior art PC board layout incorporating the prior art IC's of FIG. 1 in a symmetrically blocked architecture.
Figure 3:
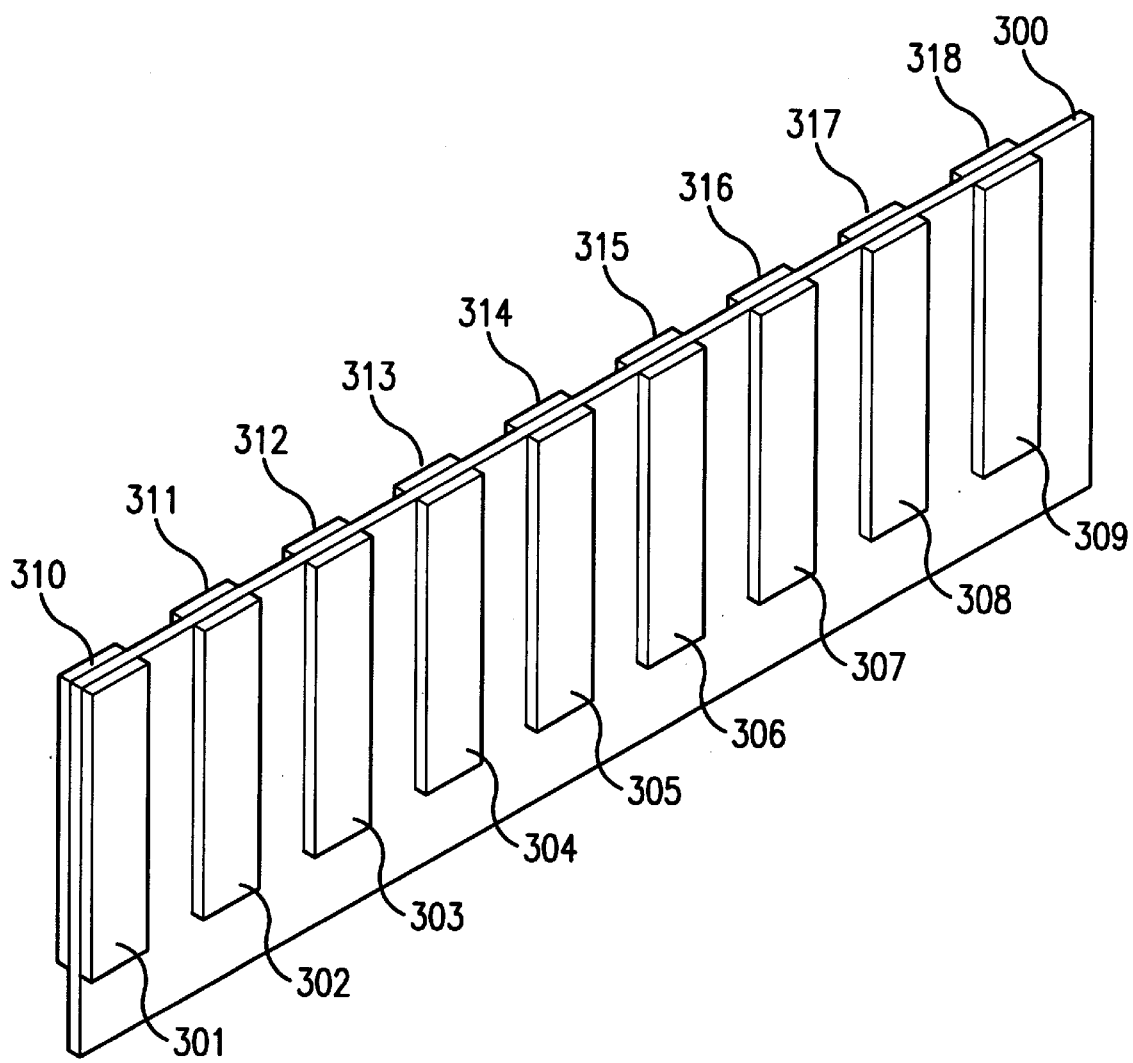
FIG. 3 is a perspective view of a memory module having SDRAM's mounted on both sides of a memory module PC board.

With reference now to the drawings wherein like reference numerals designate corresponding parts throughout the several views, FIG. 3 illustrates a perspective view of an SMT memory module board 300 having two identical sides, each containing nine SDRAM's (301–309 and 310–318. Since only one type of SDRAM must be purchased, the cost of purchasing and installation is decreased. During operation, and/or upon system bootup, SDRAM's from one side or "bank" are provided an invert signal and are configured with a reverse pin assignment such that identical address pin assignments will be adjacent to each other on opposite sides of the memory module board and connected by vias (not shown).

Figure 4:
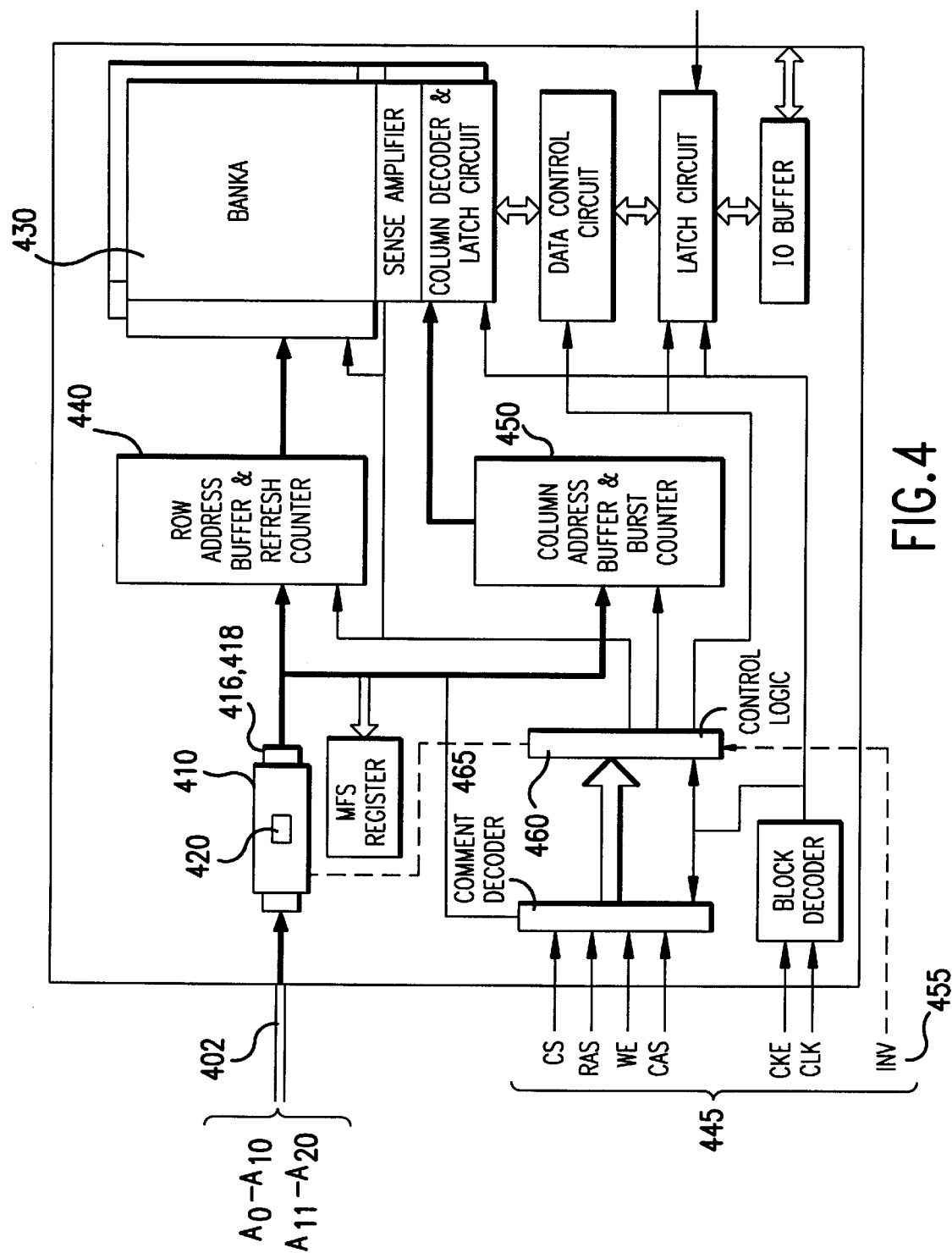
FIG. 4 is a plan view of the top of an SDRAM constructed in accordance with the preferred embodiment of the invention.

A schematic diagram of an integrated circuit memory 400 is shown in FIG.4. The memory 400 includes an address bus 402 having address pins corresponding to both memory row and column addresses (A0–A10 and A11–A20). These addresses are multiplexed together through standard techniques to reduce the total pin count. The address bus 402 is coupled internally to a signal switch 410. A plurality of internal row addresses 416 and internal column addresses 418 couple the signal switch to the memory bank 430 through a row address buffer 440 and a column address buffer 450, respectively. The signal switch 410 further comprises a set of remap-multiplexers 420 coupling the address bus 402 to the internal row addresses 416 and the internal column addresses 418 for remapping the address pins of the address bus 402 to a new set of remap addresses. In particular, the signal switch 410 is responsible for supplying the memory bank 430 with a physical address as received from the address bus 402 or a remap address as remapped by the remap-multiplexers 420 representing a "virtual"0 reverse pin assignment.

A plurality of external control signals leads communicate control signals to a control logic 460. The control logic 460, is employed for processing these external control signals and generating internal control signals that control the timing of row address and column address buffers (440 and 450) to access individual memory bank cells in the memory bank 430. A special external invert control signal 455 is defined for directing the control logic 460 to generate an internal invert control signal 465 for controlling the remap-multiplexers 420 in the signal switch 410.

FIG. 5(a) is a diagram of the signal switch in which the remap-multiplexer 420 in the disenabled state such that the address bus and associated address pins are not remapped. For example, left and right external addresses (ALx) and (ARx) at the input of the signal switch correspond directly with the internal addresses (AiLx) and (AiRx). FIG. 5(b) is a diagram of the remap-multiplexer 420 in the enabled state such that the address bus and associated address pins are oriented with a reverse pin assignment. For example, left and right external addresses (ALx) and (ARx) at the input of the signal switch now correspond to the internal row addresses (AiRx) and (AiLx), respectfully. The remapping is transparent to the memory and results in a "virtual" reverse pin assignment.

In an alternative embodiment of the invention, firmware is employed to define a new command in the IC command set. For example, the functional description of a Samsung KM41654030A CMOS 1MX16BitX4 Bank Synchronous DRAM as published on Apr. 1st, 1996 by Samsung Electronics, employs a function truth table that uses control signals as commands. Most IC's have several combinations of control signals which are left undefined such that they may be defined by a memory module designer. Any of these undefined commands may be employed as a "virtual" address command. For example, in the Samsung 1MX16Bit DRAM, an undefined command has a CS pin as a logic high and the RAS, CAS and WE pins as "don't care". Once the virtual address command is defined, it will only be issued for the appropriate bank or individual SDRAM's where the SDRAM's are wired "virtually". Therefore, the clock enable signal (CKE) should be used to prevent other banks (ie the ones with non virtual addresses) from listening to this virtual addressing mode command) In this manner, the new virtual command is defined in firmware to activate the remap-multiplexers in the signal switch directly. In particular, the user programs a new mode register command after a virtual address command such that the circuit will interpret the mode of operation in accordance to the new virtual address. The signal switch 420 will only be activated if (1) the external INV signal 455 is asserted, or (2) the mode register set has been programmed in firmware to enable the remapping feature.

Figure 6A:
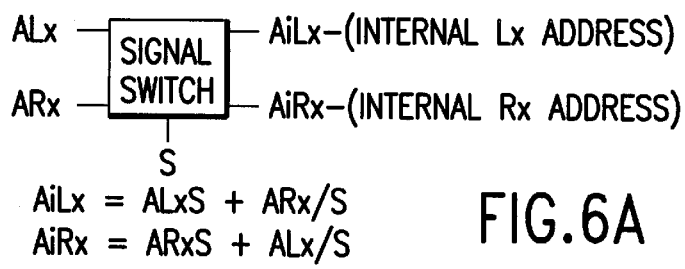
FIG. 6A depicts the exterior ALx and the ARx address pins and the AiLx and AiRx interior address portion of the signal switch 410 illustrated in FIG. 4.
Figure 6B:
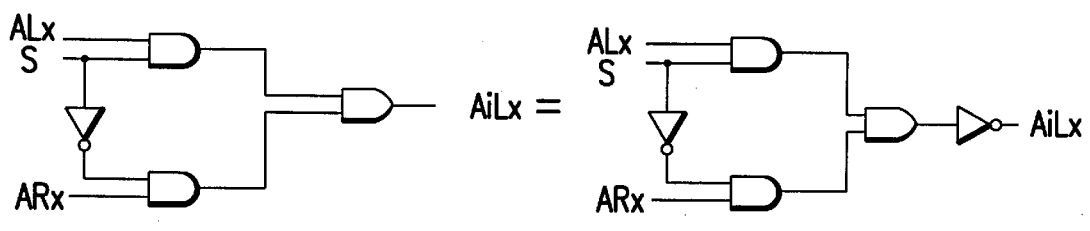
FIG. 6B is a gate logic diagram implementation for the portion of the signal switch 410 depicted in FIG. 6A.
Figure 6C:
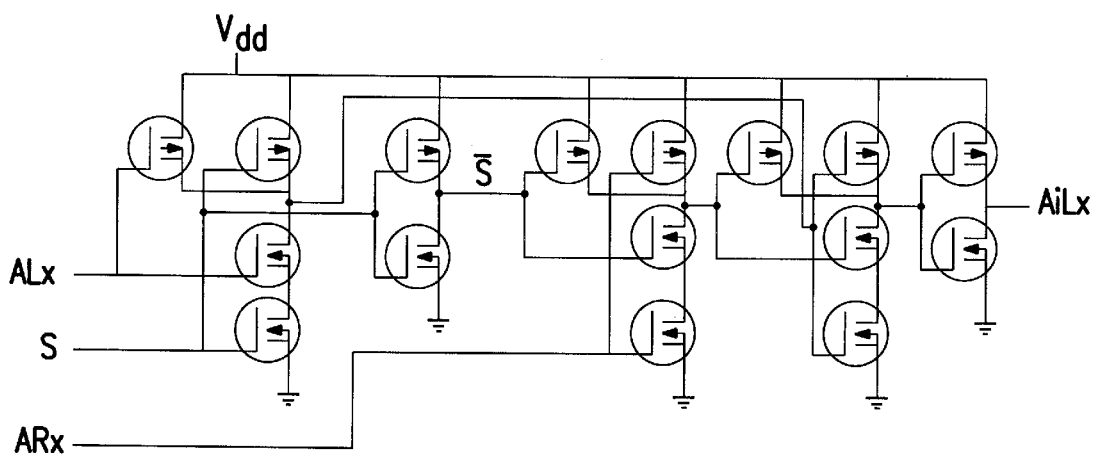
FIG. 6C is a CMOS logic implementation of the portion of the signal switch 410 depicted in FIG. 6A.

FIG. 6A depicts the exterior ALx and the ARx address pins and the AiLx and AiRx interior address portion of the signal switch 410 illustrated in FIG. 4. An control signal S is employed for actuating the switch in accordance with the switch function AiLx=ALxS+ARx/S, and AiRx=ARXS+ ALx/S. FIG. 6B is a gate logic diagram implementation for the portion of the signal switch 410 depicted in FIG. 6A in which either AND or NAND gates may be employed. FIG. 6C is a CMOS logic implementation of the portion of the signal switch 410 depicted in FIG. 6A which illustrates how the interior address AiLx may be obtained from the exterior address ALx or ARx.

While the invention has been described and illustrated with reference to specific embodiments in the area of SDRAM's, those skilled in the art will recognize that modification and variations may be made such that the invention is equally applicable to other IC's in which both a standard and a reverse pin assignment are desired. For example, where multiple microprocessors are employed, it is convenient to offer a reverse pin assignment on either or both sides of a PC board.

What is claimed is:

1. An integrated circuit, comprising:

a memory bank having memory locations addressable by row and column, a row address buffer coupled to the memory bank for addressing a row of memory locations, a column address buffer coupled to the memory bank for addressing a column of memory locations, a plurality of column and row address pins, a plurality of control signals pins, an internal memory bus that distributes addresses to the row and column address buffers, a signal switch through which a plurality of external addresses are connected, a plurality of internal row addresses coupled to the row address buffer, a plurality of internal column addresses coupled to the column address buffer, and a plurality of remap-multiplexers for remapping the external addresses to the internal memory bus, control logic electrically coupled to the signal switch for actuating the remap-multiplexers in response to a control signal, and for actuating the row address and column address buffers to access individual memory bank cells as identified by the internal row address buffers and the internal column address buffers.

2. The integrated circuit as claimed in claim 1, the plurality of control signal pins further comprising an INV signal pin.

3. The integrated circuit as claimed in claim 1, further comprising an INV control signal generated as a firmware command.

4. A integrated circuit memory, comprising:

a multiplexed address bus having address pins, a plurality of internal row addresses and internal column addresses, a row address buffer and a column address buffer, a signal switch comprising a set of remap-multiplexers for coupling the address bus to the internal row addresses and the internal column addresses, the signal switch further comprising a set of remap-multiplexers for remapping the address pins of the address bus to a new set of internal column and internal row addresses, a memory bank coupled to the signal switch through the row address buffer and the column address buffer, wherein data is retrieved from the memory bank location identified a physical address as received from the re-multiplexers, a plurality of external control signals leads, including an invert signal lead, control logic coupled to the external control signal leads, for generating internal control signals that control the timing of row address and column address buffers wherein the invert signal actuates the remap-multiplexer to reverse the pin assignments.

5. The integrated circuit memory as claimed in claim 4, further comprising a mode register set programmed in firmware to enable the actuation of the remap-multiplexers.

6. A method for providing both a standard and a reverse pin assignment on an integrated circuit memory having a multiplexed address bus, a plurality of internal row and column addresses and a row address buffer and a column address buffer for interfacing with a memory bank, with comprising the method steps of:

coupling the address bus to the internal row addresses and the internal column addresses through a signal switch, the signal switch further comprising a set of remap-multiplexers, actuating the remap-multiplexers in response to a received invert signal to remap the address pins of the address bus to a new set of internal column and row addresses, retrieving data from the memory bank location identified by the physical address as received from the re-multiplexers.

7. The method for providing both a standard and a reverse pin assignment on an integrated circuit memory as claimed in method claim 6, further comprising the method step of generating internal control signals that control the timing of row address and column address buffers wherein the invert signal actuates the remap-multiplexer to reverse the pin assignments.

8. The method for providing both a standard and a reverse pin assignment on an integrated circuit memory as claimed in method claim 6, further comprising the method step of programming a mode register set in firmware to enable the actuation of the remap-multiplexers.

* * * * *